US010114721B2

(12) United States Patent
Roth et al.

(10) Patent No.: US 10,114,721 B2
(45) Date of Patent: Oct. 30, 2018

(54) POWER CONSUMPTION ASSESMENT OF AN HVAC SYSTEM

(71) Applicant: SENSIBO LTD., Tel Aviv (IL)

(72) Inventors: Ran Roth, Tel Aviv (IL); Omer Enbar, Tel Aviv (IL)

(73) Assignee: SENSIBO LTD., Tel Aviv (IL)

( * ) Notice: Subject to any disclaimer, the term of this patent is extended or adjusted under 35 U.S.C. 154(b) by 213 days.

(21) Appl. No.: 14/902,056

(22) PCT Filed: Aug. 14, 2014

(86) PCT No.: PCT/IL2014/050735
§ 371 (c)(1),
(2) Date: Dec. 30, 2015

(87) PCT Pub. No.: WO2015/025317
PCT Pub. Date: Feb. 26, 2015

(65) Prior Publication Data
US 2016/0364313 A1      Dec. 15, 2016

Related U.S. Application Data

(60) Provisional application No. 61/867,072, filed on Aug. 18, 2013, provisional application No. 61/992,933, filed on May 14, 2014.

(51) Int. Cl.
*G06Q 30/02*      (2012.01)
*G06F 11/30*      (2006.01)
(Continued)

(52) U.S. Cl.
CPC ...... *G06F 11/3062* (2013.01); *G06F 11/3058* (2013.01); *G06F 11/3442* (2013.01);
(Continued)

(58) Field of Classification Search
CPC ............ F24F 2011/0094; F24F 11/006; F24F 11/0086; F24F 2011/0047; F24F 11/0012;
(Continued)

(56) References Cited

U.S. PATENT DOCUMENTS

2011/0106316 A1* 5/2011 Drew ................. G05D 23/1902
700/278
2012/0101648 A1    4/2012 Federspiel et al.
(Continued)

FOREIGN PATENT DOCUMENTS

CN      201463177 U     5/2010
DE      102009058163 A1 6/2011
(Continued)

OTHER PUBLICATIONS

International Search Report dated Dec. 4, 2014 issued in PCT/IL2014/050735.

*Primary Examiner* — Jaehwan Oh
(74) *Attorney, Agent, or Firm* — Tutunjian & Bitetto, P.C.

(57) ABSTRACT

Method, system and product for assessments of an operation of an Heating Ventilation or Air-Conditioning (HVAC) unit. In module for receiving, directly or indirectly, information from at least one sensor; and a power consumption determination component for indirectly assessing power consumption of an HVAC unit from the information received from the at least one sensor. In another embodiment, the apparatus being configured to receive a set of physical measurements over time from a physical location that is affected by the HVAC unit; fitting the set of physical measurements on a predetermined curve using parametric fit, wherein the predetermined curve has an horizontal asymptote, wherein the predetermined curve has a decreasing slope over time; and comparing a target measurement of the HVAC unit with a location of the horizontal asymptote (Continued)

to determine whether the HVAC unit is expected to reach the target measurement.

24 Claims, 4 Drawing Sheets

(51) Int. Cl.
    *G06F 11/34*     (2006.01)
    *G01R 22/10*     (2006.01)
    *F24F 11/47*     (2018.01)

(52) U.S. Cl.
    CPC ............... *F24F 11/47* (2018.01); *G01R 22/10* (2013.01); *Y02D 10/34* (2018.01)

(58) Field of Classification Search
    CPC ....... F24F 2011/0075; F24F 2011/0091; F24F 2011/0093
    See application file for complete search history.

(56) References Cited

U.S. PATENT DOCUMENTS

| | | | | |
|---|---|---|---|---|
| 2012/0125592 A1* | 5/2012 | Fadell | ................. | F24F 11/0012 165/201 |
| 2013/0179373 A1* | 7/2013 | Mutchnik | .......... | G06Q 30/0283 705/412 |

FOREIGN PATENT DOCUMENTS

| | | |
|---|---|---|
| EP | 2400440 A1 | 12/2011 |
| JP | 2009-020824 A | 1/2009 |
| KR | 10-0949044 | 3/2010 |
| TW | 201310260 A1 | 3/2013 |

\* cited by examiner

POWER CONSUMPTION ASSESMENT OF AN HVAC SYSTEM

CROSS-REFERENCE TO RELATED APPLICATION

This application claims the benefit of U.S. Provisional Application No. 61/867,072 filed Aug. 18, 2013, entitled "Power consumption prediction and estimation of an HVAC system by using passive readings of temperature and/or humidity sensors", and of U.S. Provisional Application No. 61/992,993 filed May 14, 2014, entitled "A completely external and cable free device and system that connects air conditioners to the internet and uses sensory data to provide superior comfort and energy savings", both of which are hereby incorporated by reference in their entirety.

TECHNICAL FIELD

The present disclosure relates to controlling a Heating, Ventilation, or Air Conditioning (HVAC) system in general, and for estimating and predicting the power consumption of HVAC units, in particular.

BACKGROUND

Heating, Ventilation, or Air Conditioning (HVAC) systems constitute a significant factor in the energy consumption of residential as well as commercial consumers.

Existing HVAC system specifications usually state the expected power consumption or energy rating of the units. However, the actual power consumption of each unit may be significantly different due to one or more of a multiplicity of factors, such as installation location or configuration, frequency of use, target temperature, fan settings, local weather which may include outside temperature or humidity conditions, room or space size, room occupancy, or others.

During normal use, the actual power consumption of the appliance is usually not measured or not shown to the user, thus leaving the user ignorant as of the actual power consumption of the appliance. However, this actual power consumption, or at least a close estimation thereof, may have great importance to the user since it may translate directly to cost to be borne by the user.

Additionally or alternatively, the manner in which a certain HVAC system is installed and used can directly affect its power consumption. The usage manner may relate to aspects such as the number and types of installed units, installation location, target temperature and fan settings, or others. Some of the factors present inherent trade-off between the user's comfort and the power consumption, or between initial purchasing and installation costs and ongoing power consumption. Thus, providing a user with information about the power consumption may be important to the user's decisions, such as how to set or operate the unit on an on-going basis, whether the user should replace the unit to a unit which is more economical or more appropriate for the room or area, or the like.

In addition to the actual power consumption, estimating the efficiency of the unit, as may be related to cooling, warming, dehumidifying, or the like, may also be of value to the user. For example, detecting a degradation of the appliance's efficiency with time, may indicate a need for maintenance operations, such as filter cleaning or replacing, changing or refilling the refrigerant coolant, or the like.

Some known solutions for estimating the power consumption of electrical appliances include power consumption meters which connect between the power outlet and the appliance. These meters may provide information such as momentary power consumption, accumulated consumption, expected monthly consumption, or the like. While these meters may have high accuracy, they may be hard to install, as the power plug of a unit may not always be accessed easily. This is especially true in the case of compressors of HVAC units which may be placed externally to the room, high up on a wall or even concealed above the ceiling. In some cases there may even not be any outlet plug, but the unit may connect directly to the power lines.

Moreover, currently available meters are generally unable to predict future energy consumption as may be affected by user actions such as changing the target temperature, or increasing the fan speed, thus leaving the user with a coarse binary decision of turning the system on or off.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

One technical problem dealt with by the disclosed subject matter is the need to estimate the current power consumption of appliances and in particular Heating, Ventilating or Air-Conditioning (HVAC) units. Although factory data or assessments of power consumption are sometimes available, the actual consumption may vary significantly due to installation and usage conditions and settings, normal wear and tear, influence by other units or appliances, or the like.

Such ongoing estimations which are specific to a particular unit may be used for assessing the monetary implications of the current activation state of the unit, or accumulations thereof.

Another technical problem relates to the assessment of future prediction of power consumption, which may be expected in response to user actions or other condition changes, such as changing the target temperature, closing a door, having more or fewer occupants in the room, or others.

Such prediction may assist in taking immediately applicable decisions such as raising or lowering the target temperature or changing fan speed, taking maintenance actions such as filter cleaning or activating another unit, or taking long term decisions such as installing or replacing HVAC units in an area. Such decisions may be taken manually by a user notified of the prediction and potentially being provided with a suggestion, or automatically without user intervention, user input, user awareness, or the like.

There is thus a need in the art for a method and apparatus for assessing current and predicted power consumption of an HVAC system.

In some cases, user control signals are available, and it is also an object of the present disclosure to provide a method and a system for correlating between such signals and the power consumption estimation, in order to provide the user with information that may be helpful in making decisions related to the usage of the HVAC.

The method and apparatus may be able to operate using only regularly available measurements, such as temperature and/or humidity. However, the assessment and prediction may improve given signals such as user control signals, third party signals such as local weather information, input from multiple sensors such as multiple temperature or humidity sensors, signals related to the room occupancy, to the open/close status of openings, or the like.

It is also an object of the present disclosure to provide recommendations to a user as related to on-going operation of the HVAC unit, taking maintenance actions or changing the HVAC setup of an environment, for example adding additional units.

It is another object of the present disclosure to enable the usage of external meters, such as meters that provide financial information, in cases where connecting such meters to the HVAC unit is impossible, impractical, or not desirable.

One technical solution is to provide a control unit that indirectly estimates and predicts the power consumption of one or more HVAC systems using information obtained from sensors such as temperature and/or humidity sensors. The sensors may be located in a location affected by HVAC unit. For simplicity, the discussion below relates to cooling. It will, however, be appreciated that it is equally applicable to other effects of the HVAC unit and in particular heating or dehumidifying. The solution may be implemented by a controller implemented as part of the HVAC unit, or externally to the HVAC unit, for example as part of a remote control of the unit, or on a separate component.

On a calibration stage, which may be performed for a particular HVAC model or a particular unit, a long term buffer may be obtained, in which the sensors measurements are received by a controller maintaining such buffer containing a collection of measurements representing a baseline behavior of the HVAC unit or model. The baseline may represent the cooling properties of the HVAC system, e.g., how much time it takes to reach a specific target temperature, the range of target temperatures that can be reached, or the like. The baseline may comprise one or more measurement sets, related for example to different target temperatures, different seasons or hours, different occupancy levels of the area, or other changing conditions. The baseline behavior may comprise one or more graphs describing the behavior of the unit, for example the room temperature as a function of time. The baseline may further comprise a mapping between the unit activation in general or under certain conditions and its power consumption. For example, the power consumption when the unit runs at different motor speeds, may be obtained.

Once the baseline is available, measurements may be received on an ongoing basis from sensors. The measurements may be received from any sensor adapted to export or otherwise provide or report its measurements. The measurements may be collected over a sliding time window, and analyzed in comparison to the baseline behavior(s). If the behavior is consistent with any of the baseline behaviors for a while, it may be assumed that the current conditions and settings are similar to that of the baseline behavior, and the current or accumulated power consumption may be estimated. In addition to measurements, the power consumption estimation may also make use of user-initiated signals such as signals emitted by a remote control, Infrared sensors, security system, temperature sensors on smartphones or other devices, ceiling fan, heating systems, other HVAC units, third party data such as weather information, signals generated by correlating a multiplicity of near-by sensor readings, occupancy sensor information, signals received from door or window control systems, or others.

Additionally or alternatively, alerts may be issued to the user. For example, if the unit behavior is consistent with the behavior of an unreachable target temperature, the user may receive a recommendation to increase the target temperature to avoid uselessly uneconomical behavior.

If the behavior is first consistent with a baseline behavior and then a deviation is detected, a possible cause of the deviation may be identified and a corrective action may be suggested to the user. For example, if a sudden rise in the temperature or humidity is detected, it may be deduced that an opening in the location in which the HVAC unit is installed, such as a door or a window, has been opened. If the temperature rise does not subside it may be suggested to the user to close the opening.

If it is detected that the HVAC unit is not as efficient as in an associated baseline, it may be deduced that the unit needs periodical maintenance, such as filter cleaning, and a corresponding suggestion may be presented to a user.

If the corrective action is related to changing the settings of the HVAC unit, the controller may issue a corresponding command and the unit settings may change automatically without requiring any action on the user's side. Additionally or alternatively, the user may or may not be aware of the change that was made.

Given the baseline behavior corresponding to the current measurements, one or more future power consumptions may be estimated. For example, predicted power consumptions may be estimated if the current conditions are maintained, if the temperature is raised or lowered by one or more degrees, if additional units are operated, or the like.

One technical effect of the disclosed subject matter is estimating the actual power consumption of an electrical appliance, without directly measuring the power consumption of the unit but rather from external measurements. The power consumption estimation may be of high importance to users, since it may be immediately translated to costs. The estimation may make use and integrate into the estimation also user signals such as signals received from a remote control, third party signals such as local weather information, input from multiple sensors such as multiple temperature or humidity sensors, signals from occupancy sensors, signals from the HVAC unit, network signals, or the like.

Another technical effect of the disclosed subject matter is the prediction of future power consumption under one or more sets of conditions or assumptions, such that the user may select whether or not to perform an action, taking into account the expected power consumption.

Yet another technical effect of the disclosed subject matter is identifying situations in which one or more short term actions may reduce the power consumption without substantially effecting the performance, and suggesting to the user to take any of these actions, for example changing the target temperature, changing the fan speed, closing a door or window if one was opened, turning on or off one or more units, or the like.

Yet another technical effect of the disclosed subject matter relates to the option of using any temperature or humidity sensors, thus enabling a user to use existing sensors installed for other purposes, without incurring additional costs associated with installing additional sensors.

Yet another technical effect of the disclosed subject matter relates to the ability to overcome differences in sensors measurements, such as readings of the sensors of the HVAC unit and the readings of sensors external to the HVAC unit. The disclosed subject matter may be used to estimate the readings by the sensors of the HVAC unit based on readings of external sensors. The estimated readings may be used to perform actions and manipulations on the HVAC unit, such as determining to which target temperature the HVAC unit should be set.

Figure 1:
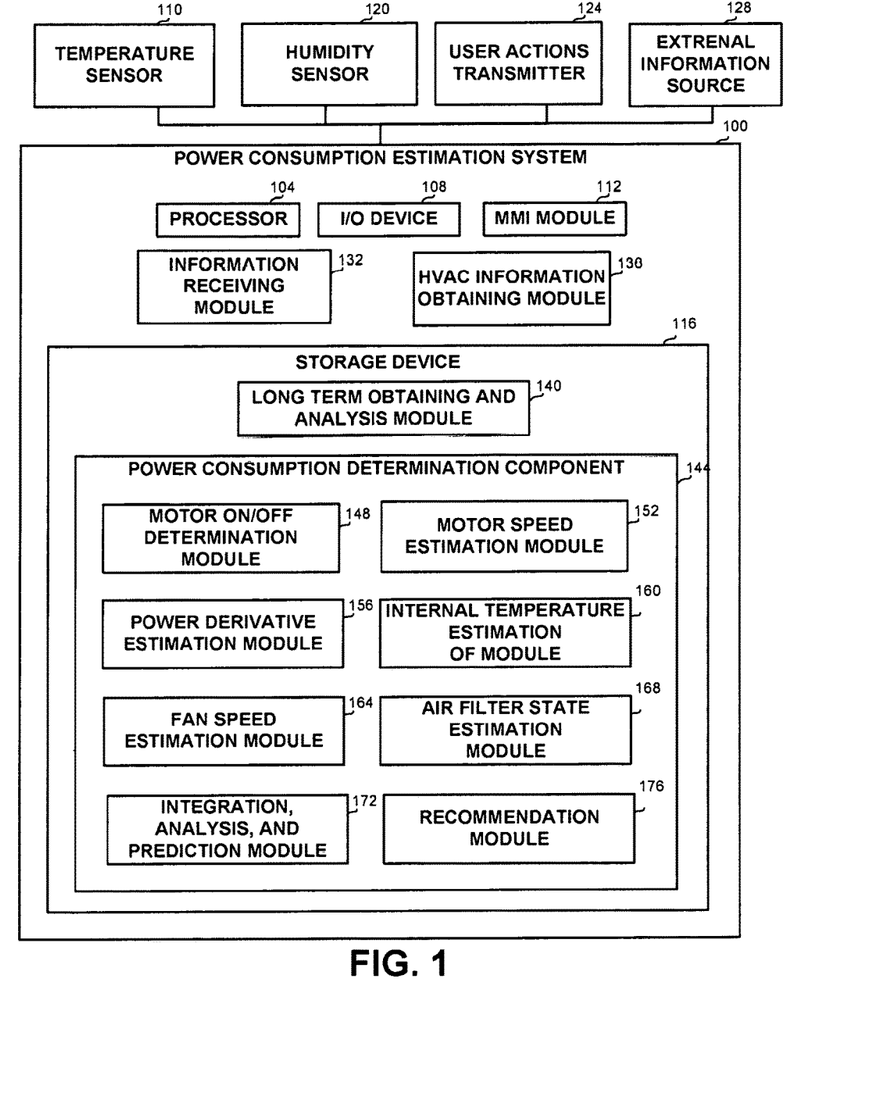
FIG. 1 is a schematic illustration of a system for power consumption estimation and prediction of an HVAC unit, in accordance with some exemplary embodiments of the disclosed subject matter.

Referring now to FIG. 1, showing a schematic illustration of a system for power consumption estimation and prediction of an HVAC unit, in accordance with an embodiment of the disclosed subject matter.

The power consumption and prediction system, generally referenced 100, is in communication with one or more information sources, such as but not limited to one or more temperature sensor(s) 110 or one or more humidity sensor(s) 120, one or more user actions transmitter 124, such as a remote control transmitting commands from a user, or one or more additional information sources 128, such as but not limited to a weather information source, occupancy sensor, opening sensor, or the like. Each sensor or information source may be mounted on the HVAC unit, otherwise collocated with the HVAC unit, or constitute a part of the HVAC unit, located anywhere within the area relevant for the HVAC, or remote, depending on the type of the sensor or source. System 100 may be configured to receive the information from sources, such as 110, 120, 124, 128 or the like, either directly or indirectly. In some exemplary embodiments, the information may be received via a wired connection or wireless connection. Additionally or alternatively, the information may be received via a computerized network, such as the Internet, a Local Area Network (LAN), or the like, to which both system 100 and the source may be connected.

It will be appreciated that any of the sensors may be a general purpose commercially available sensor adapted to provide information or measurements in any channel and format acceptable by system 100, such as any wired or wireless communication protocol. None of the sensors is required to be of a specific type or be installed using specific installation. It will, however, be appreciated that sensors such as temperature or humidity sensors should be installed such that their measurements represent the situation at relevant areas, for example areas that are influenced by the HVAC system being measured.

System 100 may comprise one or more processor(s) 104. Processor 104 may be a Central Processing Unit (CPU), a microprocessor, an electronic circuit, an Integrated Circuit (IC) or the like. Processor 104 may be utilized to perform computations required by the system 100 or any of it subcomponents.

In some exemplary embodiments of the disclosed subject matter, system 100 may comprise an Input/Output (I/O) device 108 such as a display, buttons, a pointing device, a keyboard, a touch screen, or the like. I/O device 108 may also comprise a disk drive or may provide communication with a storage device or with a network.

System 100 may comprise a Man-Machine Interface (MMI) module 112 which may be utilized to provide output to and receive input from a user using any one or more of I/O devices 108. The output may comprise estimated, accumulated or predicted power consumption, or information based thereon, such as recommendations, expected cost, or the like. MMI module 112 may also be used for displaying to a user current measurements such as temperature or humidity, as measured by a sensor external to the HVAC unit, as measured by an internal sensor of the HVAC unit or estimation thereof, the target temperature or humidity, the expected time it will take the HVAC unit to cool the room to get to the target temperature, the expected power consumption required for cooling the room to the target temperature, or any other relevant information.

System 100 may comprise one or more information receiving components 132 for receiving measurements or information from one or more of temperature sensor 110, humidity sensor 120, user actions transmitter 124, external information sources 124, or other sensors or information source. As another example of an additional sensor, in some exemplary embodiments a vibration sensor that is installed on the HVAC unit may provide information which may be useful to estimate whether the HVAC compressor is active or not.

System 100 may also comprise HVAC information obtaining module 136 for receiving information directly or indirectly from an HVAC system. For example, the HVAC unit may send signals indicating motor on/off, fan speed change, flap direction change, or the like. The signals may be received or intercepted by module 136 and the extracted information may be used.

In some exemplary embodiments, system 100 may comprise a storage device 116. Storage device 116 may be a hard disk drive, a Flash disk, a Random Access Memory (RAM), a memory chip, or the like. In some exemplary embodiments, storage device 116 may retain program code operative to cause processor 104 to perform acts associated with any of the subcomponents of system 100. The components detailed below may be implemented as one or more sets of interrelated computer instructions, executed for example by processor 104 or by another processor. The components may be implemented as assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

Storage device 116 may comprise long term obtaining and analysis module 140, also referred to as long term module, for obtaining and analyzing information describing a baseline behavior of the HVAC unit as provided by the manufacturer, or in the specific environment.

Long term analysis module 140 may receive measurements and extract information about the cooling properties of the HVAC unit, which may be referred to as "learned properties" of the unit e.g., how much time it takes to reach target temperature, which target temperatures can be reached, etc. The information may be collected over a relatively long term that is sufficient to learn the properties of the HVAC unit and its operation, such as several hours, a week, a month, a year, or the like. The information may be collected and stored for future use. For example, information may be later used to refine the approximation of other modules detailed below. The long term behavior may be used when in finding deviations from the usual or expected behavior or operation mode of the HVAC unit. However, it will be appreciated that in some applications, long term analysis module 140 may be omitted.

The long term behavior may be represented by a collection of points each representing a temperature at a specific time. If a visual display is provided, the points may be connected to form a graph, as shown for example in FIGS. 2A and 2B. Additionally or alternatively, the long term behavior may be represented as a sequence of HVAC actions such as motor on/off, motor or fan speed changes, or the like, each possibly associated with a time stamp. The long term behavior may retain information such as power consumption associated with certain states, such as the power consumption in motor on state, the power consumption with different motor speeds if such are available, power consumption at different temperatures, or the like.

In some embodiments, the long term behavior information may be provided by the manufacturer of the HVAC or by a third party, for example in any format such as text, spreadsheet or any proprietary format. The behavior may be a priori provided and retained in a computer readable format. As an example, the behavior may be stored in computer readable file retaining the behavior in any computer readable format. Additionally or alternatively, the behavior may be retained in a data storage.

In some embodiments, the long term behavior information may be provided by a user who may input an observation of the specific unit behavior. The mapping may be provided using a user interface through which the user can select the target temperature or humidity, and receive the HVAC behavior, for example, compressor on/off state, motor speed, fan speed, fan direction, flap movements, or the like. The HVAC behavior may be provided to system 100 as a baseline behavior.

In further embodiments, the behavior may be automatically obtained by the system, for example after installation or reset of the unit. The behavior may be obtained by setting the target temperature and receiving the relevant measurements. In some embodiments, long term analysis module 140 may learn the correlation between the local weather information and the time or the power it takes to cool the space. This learning may be done passively, but in some embodiments may be done actively by cooling the space at times in which different outside temperatures are reported, which may be done, for example, when the user is known to be out.

Figure 2A:
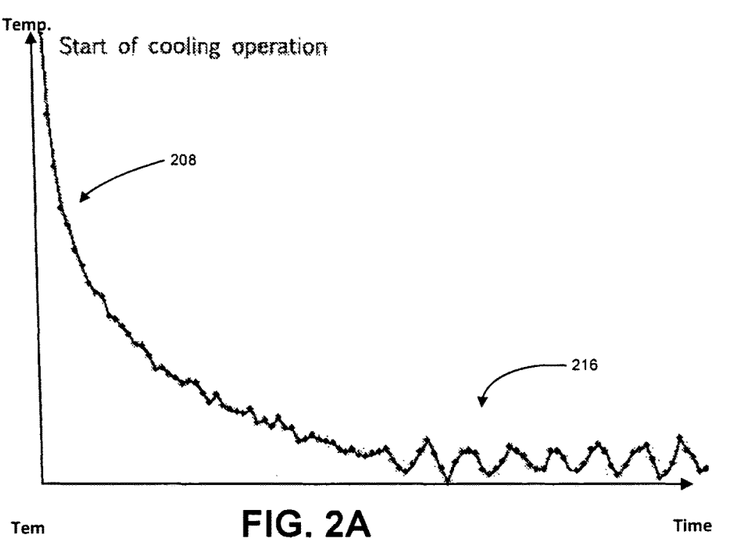
FIG. 2A is an exemplary graph of the temperature over time in an area in which an HVAC system is used, wherein the target temperature is reached.
Figure 2B:
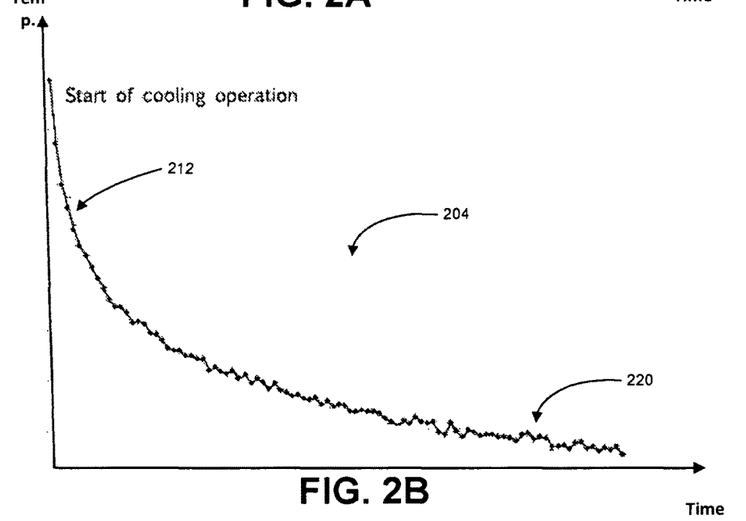
FIG. 2B is an exemplary graph of the temperature over time in an area in which an HVAC system is used, wherein the target temperature is not reached.

Referring now to FIGS. 2A and 2B, showing graphs 200 and 204, respectively of the temperature over time in two situations. FIG. 2A shows the temperature over relative or absolute time in an environment and setting in which the target temperature is reached and maintained, while FIG. 2B shows the temperature over relative or absolute time in an environment and setting in which the target temperature is not reached. Both graphs present an efficient behavior area 208 and 212, respectively, at the time following the start of the cooling operation. FIG. 2A then shows area 216 in which the target temperature is reached and maintained, as shown by the substantially equal minimum values of the graph. Such behavior may be obtained by periodically turning the compressor on and off. FIG. 2B, however, shows area 220 in which the temperature changes over time decrease indefinitely, and the measured temperature approaches asymptotically a steady state temperature. Such behavior is typical in situations in which the target temperature is not reached, which causes the unit to work in an inefficient manner. In such situation, increasing the target temperature in one or more degrees may provide for temperature measurements which are not significantly different from those of FIG. 2B, but are achieved by operating the HVAC unit in a more efficient manner.

It will be appreciated that long term analysis module 140 may be used for assessing one or more baselines related to further behaviors of the unit, such as estimation of the difference between an externally measured temperature and the internal temperature of the device, the fan speed of the device, as detailed below in association with specific modules.

It will be appreciated that the received measurements or the modules listed below may be stored physically on the same device as one or more of the measurement sensors. In other applications, the sensor information may be received from the measurement sensors which may reside anywhere, and some or all processing may be done on a different platform which may be nearby or remote.

Referring now back to FIG. 1, storage device 116 may comprise power consumption determination component 144, optionally containing a multiplicity of specific modules for identifying specific behaviors, and one or more modules for integrating the behaviors, analyzing them, establishing recommendations, providing the current and predicted power consumption of the unit or the recommendations. The specific modules may include any one or more of the modules detailed below, but it will be appreciated that further modules may also be used.

In some embodiments, power consumption determination component 144 may comprise a motor on/off module 148 which determines at a given time whether the motor is active or not.

In a typical operation of an HVAC unit, the temperature drops until it reaches the target temperature. At this stage, based on a reading of the unit's thermostat, the motor may be stopped and started in periodical cycles in order to keep the temperature approximately constant, as shown for example in FIG. 2A. However, if the target temperature cannot be reached, the motor will not stop and the room will eventually reach a thermally steady state, as shown in FIG. 2B. Using the shown patterns, motor on/off module 148 can determine at a given point in time whether the motor is currently on or off. This may be done by inspecting the measurement's graph for a drop in the temperature or humidity, which indicates motor activity.

When estimating whether the motor is on or off, if the temperature pattern is similar to that of FIG. 2A, then it may be determined that the motor was on until reaching the target temperature or humidity indicated by the minimas of the periodical pattern. After reaching this pattern, it is derived that the motor is on in the periods on which the temperature decreases and off while the temperature increases. If, however, the observed graph is similar to that of FIG. 2B, it may be determined that the motor was on the whole time.

In further embodiments, motor on/off module 148 may determine whether the motor is on or off based on signals received from a vibration sensor installed on or in the vicinity of the HVAC unit or compressor and sensing the vibrations of the HVAC unit. Additionally or alternatively, a microphone may be used to sense sounds that are emitted by the motor when operating.

In environment in which a user controls the HVAC unit, such as by providing on/off commands, such information may be provided as input from the user (e.g., by intercepting the command to the HVAC unit) and may not be derived automatically from sensors.

Power consumption determination component 144 may comprise a motor speed estimation module 152, which may be used when the HVAC unit is an inverter air conditioner that supports activations with varying motor speeds. In such systems, the effect of changing the motor speed can be determined by observing the slope of the temperature/humidity change when the motor is on. The motor speed is generally associated with the derivative of the temperature or humidity graph over time such that the steeper the slope, the higher is the motor speed. The possible motor speeds, which may be discrete or continuous, may be obtained from the information provided by long term obtaining and analysis module 140.

Power consumption determination component 144 may comprise a power derivative (dP/dT) estimation module 156 for estimating the power consumption needed in order to cool or warm the room in one degree, assuming that the motor will be turned on (in a specific speed, if applicable). The initial temperature decrease when cooling starts may be obtained using a parametric model, such as an exponential model. The model may be obtained using the long time behavior obtained by long term obtaining and analysis module 140, and the slope of the graph may be used to estimate the derivative dP/dT for the current control settings. Since dP/dT is estimated online, the function may further extrapolate the derivative of the temperature, assuming the compressor is on. This allows for predicting the period of time needed to cool the room by one degree at any point in time and hence the associated power consumption. The dP/dT derivative may be determined by the known power consumption of the device for the current motor speed, which may be given with the device specifications.

It will be noted that power derivative estimation module 156 may relate to humidity measurements and may be used to estimate the power consumption needed in order to reduce/increase the humidity by a single measurement unit.

Power consumption determination component 144 may comprise an internal temperature estimation module 160, for assessing the internal temperature of the HVAC unit. Typically, this temperature is used for the unit's thermostat control and is not reported externally. In order to assess the HVAC system's internal temperature state, the external temperature as measured by one or more sensors, such as a sensor installed on or near the HVAC unit, may be recorded and analyzed. In particular, the temperature at the local minimas of the wave in area 216 of FIG. 2A, may indicate the target temperature of the HVAC unit. Thus, a multiplicity of data points may be collected, each comprising the time and measured temperature, and optionally the target temperature. Once such measurements are collected, a parametric fit of the data, e.g. a linear fit may be performed, for assessing the deviation between the measured temperature and the internal measured temperature.

Figure 2C:
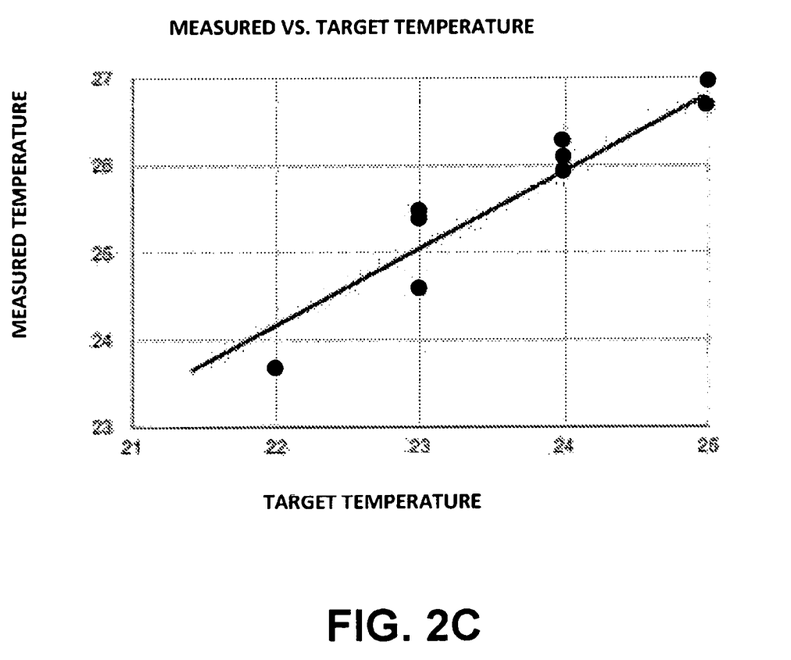
FIG. 2C is an exemplary graph of a measured temperature v. target temperature, in accordance with some embodiments of the disclosed subject matter.

Referring now to FIG. 2C, showing an exemplary collection of such data points, and a linear fit therebetween.

It will be appreciated that even if the thermostat does not reach an equilibrium state, for example as shown in FIG. 2B, the target temperature can still be deduced by a parametric fit to the graph of temperature over time as described above.

It will also be appreciated that additional data may be taken into account and incorporated into the model for estimating the internal temperature measured by the unit, such as the external temperature, the room humidity, occupancy sensor signals, or the like, since the internal and external temperature may respond differently to the weather and weather changes, for example in cases where the unit is located on an external wall or near a window, to different occupancy levels of the room, or the like.

In some exemplary embodiments, module 160 may be configured to estimate one or more other internal measurements of the HVAC, such as temperature or humidity.

Referring now back to FIG. 1, power consumption determination component 144 may comprise fan speed estimation module 164. The fan speed may be parameterized according to the delay in the system's cooling. The delay may be measured as the time it takes for the temperature drop to become apparent after the HVAC starts its cooling operation. This time measurement may have significance even when the temperature is measured in high proximity to the HVAC unit.

The delays measured between the beginning of the HVAC operation and the temperature drop may be used as data points in any clustering algorithm, such as but not limited to K-means, for determining the fan speeds, which are usually discrete, for example low, medium and high. In some embodiments, a more direct approach can be taken. The air flow from the HVAC unit may cause light vibrations whose amplitude is in correlation with the fan speed. Thus, if a sensor, whether collocated with the system or not, is placed on the HVAC unit itself, it may sense the fan level using output from a vibration sensor.

Power consumption determination component 144 may comprise an air filter state estimation module 168, for sensing the state of the air filters of the HVAC system. Clogged air filters in an HVAC system constitute a health hazard and degrade the efficiency of the HVAC system. Therefore, it is beneficial for a user to know if the filters need to be cleaned. The state of the filters may be detected using a passive temperature/humidity sensor and taking consecutive measurements of the time it takes to reach a certain target temperature. If the times become longer, a gradual degradation is exhibited in the HVAC unit efficiency. This gradual efficiency degradation can be detected and may serve as an indication that the filters need to be cleaned. Additionally or alternatively, if the vibration sensor's output degrades for similar fan levels it can indicate clogging of the filters.

It will be appreciated that although analyzing the behaviors or states described above may benefit from using information obtained by long term analysis module 140, having such long term information is not mandatory. The behaviors or states may alternatively be realized by analyzing measurements, and performing parametric fit of the measurements over a curve, such as an exponential curve of the form y=1/x, y=1/sqrt(x), y=1/ln(x), or the like. An informative model may thus be obtained, and extrapolation thereof may provide such information. For example, it may be determined whether the asymptote to the curve is below the target measurement or above it. In some cases, a target measurement below the asymptote of the curve may indicate that the target temperature cannot be reached. Additionally or alternatively, a target measurement above the asymptote of the curve may indicate that the target temperature can be efficiently reached. Additionally or alternatively, the period of time required for reaching the target temperature or the vicinity thereof, and the power consumption level required may also be estimated and provided to the user. If the difference between an internal temperature measurement of the HVAC unit and an external temperature has been analyzed, the target temperature may be presented using either scale. It will be further noted that the comparison between the target temperature and the asymptote of the curve may be performed based on measurements of the same scale, such as by transforming the internal target measurement to a scale of the external measurements or by transforming the external measurements to the scale of the internal target measurement.

Power consumption determination component 144 may comprise integration, analysis, and prediction module 172 for integrating output from the specific modules described above or different modules, and for analyzing the integrated data for estimating the power consumption of the HVAC unit. Power consumption determination component 144 may also receive measurements or indications from the various sensors. It will be appreciated that the specific modules detailed above may be implemented as part of integration, analysis, and prediction module 172. Alternatively, the specific modules may be implemented externally to integration, analysis, and prediction module 172 and information from the specific modules may be used by integration, analysis, and prediction module 172. It will be appreciated that integration, analysis, and prediction module 172 may sometime use information received from the HVAC unit itself, such as compressor on/off state, fan speed, or the like, and use the information for prediction, including power consumption prediction.

Power consumption determination component 144 may comprise recommendation module 176 for establishing one or more recommendations as to ongoing usage, maintenance activities or long term decisions regarding the HVAC unit. If the behavior is first consistent with a baseline behavior and then a deviation is detected, a possible cause of the deviation may be identified and a corrective action may be suggested to the user. Additionally or alternatively, system 100 may automatically take the suggested corrective action, such as by transmitting instructions to the HVAC unit or to other units or devices.

For example, if a sudden rise in the temperature or humidity is detected, it may be deduced that a door or a window has been opened, and if the temperature rise does not subside it may be suggested to the user to close the door or window.

In another example, if the target temperature was reached but is not reached at a later time, or if a moderate increase in the temperature is detected, it may be deduced that more people entered the room, and maybe a second unit should be operated, if possible.

In another example, if the measured temperature is indicative of an unreachable temperature, it may also be suggested to a user to increase the target temperature to enable the device to work more efficiently with similar results.

In addition to the power consumption, estimating the efficiency of the unit, as may be related to cooling, warming, dehumidifying, or the like, may also be of value to the user. For example, detecting a degradation of the appliance's efficiency with time relatively to the baseline behavior may indicate a need for maintenance operations, such as filter cleaning or replacing, changing the refrigerant coolant, or the like.

Additionally or alternatively, if inefficient behavior is detected over a long period of time, one or more long term actions may be suggested in order to reduce the power consumption, such as fixing or updating the unit, installing further units, or the like.

The integrated data, including estimation or prediction of the power supply of the unit, or the possible recommendations as to the operation of the unit or the environment and possibly their consequences, may be displayed to a user, sent to a monitoring or control system, stored in a file or a database, or otherwise used. The power consumption may be accumulated over a period of time, for example a month. The power consumption may also be extrapolated during the time period and later compared to the actual consumption. The consumption may be provided in units such as KW/hour, cost which takes into account the rates which may also vary in accordance with the day or time, or the like.

In some embodiments, if the consumption exceeds a predetermined threshold, whether momentarily or accumulatively, an alert may be issued to a user, or another action may take place, such as stopping the unit.

In some embodiments, the minimal temperature that has been reached may be automatically set as a target temperature that can be effectively reached, while allowing the motor to periodically switch off.

It will be appreciated that integration, analysis, and prediction module 172 and recommendations module 176 may also make use of additional inputs, such as but not limited to any one or more of the following:

User operation signals: knowing how the user controls the HVAC unit, if such information is available, may provide significant information for assessing the power consumption. First, if the appliance is off, the power consumption is zero, thus eliminating various possible false positive patterns. Second, the difference between the target temperature and the measured temperature may be modelled, such that it is known when the thermostat periodical on/off state is expected, thus further refining and validating the estimate.

Local weather signals: the outside temperature may affect the time it takes to cool a certain area. Thus, the local outside temperature, possibly in conjunction with the long term behavior applicable for the relevant temperature may be used in determining the power required for cooling the area to the target temperature.

It will be appreciated that the determined or predicted power consumption may be provided to a power consumption component to provide further information related to the power consumption of unit, even when such component cannot connect to the HVAC unit. Such component may provide information such as momentary or hourly activation cost of the unit, prediction of the expected monthly costs, or the like.

Figure 3:
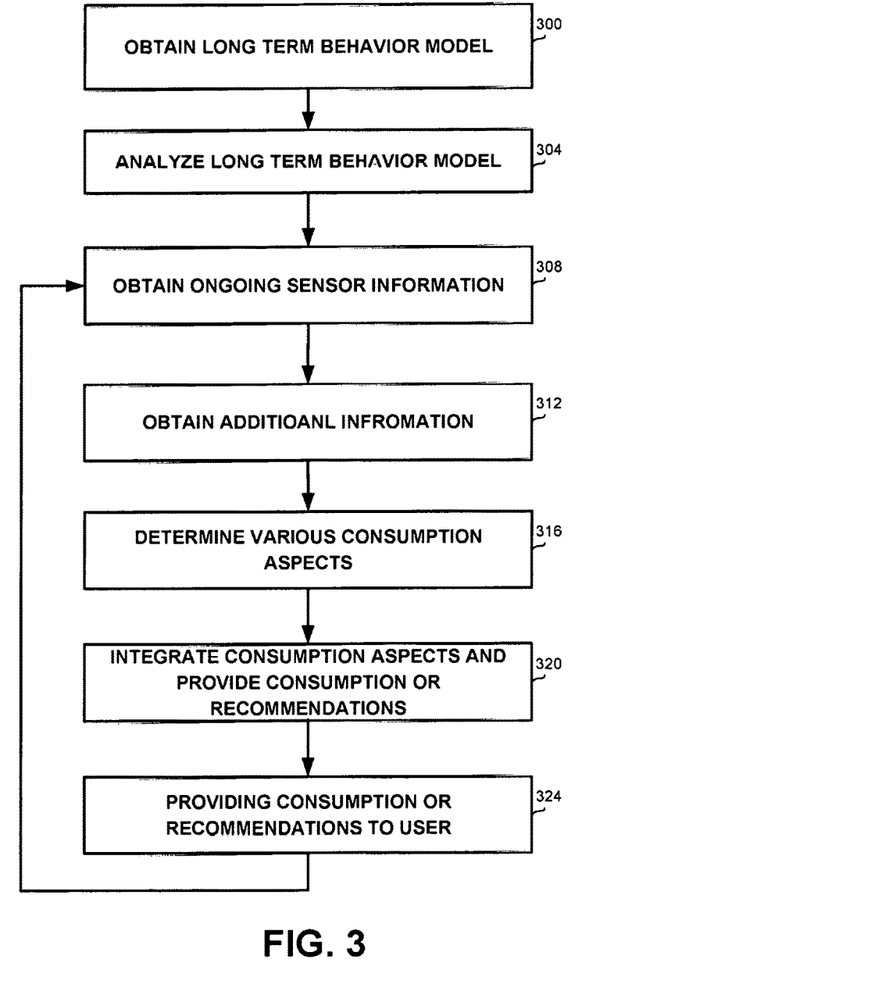
FIG. 3 is a flowchart diagram of a method for estimating and predicting the power consumption of an HVAC system, in accordance with some exemplary embodiments of the disclosed subject matter.

Referring now to FIG. 3, showing a flowchart of steps in a method for estimating or predicting the power consumption of an HVAC unit.

On step 300, a long term model of the HVAC unit behavior may be obtained. The model may be obtained from a manufacturer, from a user, by operating the unit in various conditions and measuring the behavior, or the like.

On step 304 the obtained model may be analyzed. For example, the following states or data may be obtained: determining whether the unit is operating with a reachable target temperature; determining whether the unit is operating with an unreachable target temperature; determining the power consumption for increasing or decreasing the current temperature in one degree (or any other predetermined amount of degrees), or the like.

On step 308, ongoing information may be received from one or more sensors, such as temperature sensor or humidity sensor. The sensor readings may be received continuously, at intervals, or in any other manner and using any required protocol.

On step 312, additional information may be received, such as; user actions for example turning the unit on or off, changing the target temperature or the like; occupancy sensor information; weather reports or forecasts; sensors detecting whether a door or a window has been opened; or the like.

On step 316, one or more consumption or prediction aspects may be determined, such as whether the motor is on or off; the current motor speed; the power required for increasing or decreasing the current temperature, or the like.

The aspects may be determined using the measurements received from the sensors on step 308 and 312 above, optionally by fitting or comparing them against the long term behavior as obtained on step 300 and analyzed on step 304, or by identifying deviations from the long term behavior, for example by assessing the effect of predetermined actions such as opening or closing a door or a window, or the like.

On step 320, the consumption aspects may be integrated for consumption estimation or prediction. The consumption estimation may be momentary or accumulated over a period of time. The prediction may use extrapolation of the current conditions. Additionally or alternatively, the financial aspect of the consumption may be determined, by taking into account the prices or the pricing policy.

Additionally or alternatively, if certain conditions are detected, one or more recommendations as to activating, maintaining or installing the unit or further units may be determined, as detailed in association with recommendation module 164 of FIG. 1.

On step 324, the estimations or predictions, whether in electrical consumption units or in monetary terms may be provided, for example displaying to a user over a display device, storing on a storage device, in a file, sent to a monitoring device, or the like. Additionally or alternatively, established recommendations may also be provided, for example displayed. Additionally or alternatively, the recommendations may be automatically acted upon, with or without user validation.

It will be appreciated that the disclosed method and apparatus may be used for assessing consumption of other appliances, and that the disclosed method and apparatus are not limited to HVAC units, and may be used in water heating systems, heating systems, pool warming, refrigerators, fish aquariums, ovens, systems with a thermostat fan, or the like.

It will be appreciated that given the power consumption estimate or prediction, external meters may be used which receive the estimate or prediction and provide additional information such as momentary power consumption, accumulated consumption, expected monthly consumption, or the like. Using the disclosed method and system enables the deployment of such meters when it is hard, impractical, undesirable or even impossible to connect meters directly to the HVAC unit. Moreover, the meters may provide information related to predicted energy consumption, which may be affected by user actions such as changing the target temperature or increasing the fan speed.

It will also be appreciated that the disclosed method and apparatus can be applied to an environment in which a multiplicity of units is available, such that the models, estimations and recommendations also take into account the mutual influence of the units on each other and on the environment.

The present disclosed subject matter may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosed subject matter may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosed subject matter.

Aspects of the present disclosed subject matter are described herein with reference to flowchart illustrations and/or block diagrams of methods, apparatus (systems), and computer program products according to embodiments of the disclosed subject matter. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosed subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosed subject matter has been presented for purposes of illustration and description, but is not intended to be exhaustive or limited to the disclosed subject matter in the form disclosed. Many modifications and variations will be apparent to those of ordinary skill in the art without departing from the scope and spirit of the disclosed subject matter. The embodiment was chosen and described in order to best explain the principles of the disclosed subject matter and the practical application, and to enable others of ordinary skill in the art to understand the disclosed subject matter for various embodiments with various modifications as are suited to the particular use contemplated.

What is claimed is:

1. An apparatus having a processing unit and a storage device, comprising:
    an information receiving module for receiving, directly or indirectly, information related to a Heating Ventilation or Air-Conditioning (HVAC) unit from at least one sensor external to the HVAC unit;
    a long term obtaining and analysis module for determining a behavioral model of the HVAC based on observations provided by the at least one sensor, wherein the behavioral model is determined independently of factory data of a model of the HVAC unit; and
    a power consumption determination component for indirectly assessing power consumption of the HVAC unit from the behavioral model and from further observations received from the at least one sensor.

2. The apparatus of claim 1 wherein the long term obtaining and analysis module is adapted to analyze at least one behavior of the HVAC unit.

3. The apparatus of claim 2 wherein the at least one behavior is selected from the group consisting of:
    measurement over time wherein a target measurement is reached and maintained; and
    measurement over time wherein the target measurement is not reached.

4. The apparatus of claim 3, wherein the measurement is selected from the group consisting of: temperature and humidity.

5. The apparatus of claim 1, wherein the power consumption determination component is adapted to determine current, accumulated, or predicted power consumption.

6. The apparatus of claim 1, wherein the power consumption determination component comprises an integration, analysis, and prediction module for estimating power consumption based on information from at least one module selected from the group consisting of: a motor on/off estimation module; a motor speed estimation module; a power derivative estimation module; a fan speed estimation module; an internal temperature estimation module; and an air filter state estimation module.

7. The apparatus of claim 1, wherein the power consumption determination component is adapted to identify a situation selected from the group consisting of: an open door in an area of the HVAC unit, an open window in the area of the HVAC unit, and an occupancy change in the area of the HVAC unit.

8. The apparatus of claim 7, further comprising a long term obtaining and analysis module for obtaining information describing at least one behavior of the HVAC unit, wherein the situation is identified based on deviations from the at least one behavior.

9. The apparatus of claim 1, further comprising a display for displaying at least one of: the power consumption, cost of the power consumption, information based on the power consumption; a current or a target temperature or humidity as measured by an external sensor; a current or a target temperature or humidity as measured by a sensor being a part of the HVAC unit; estimation of time required for cooling to a target temperature; and estimation of energy required for cooling to a target temperature.

10. The apparatus of claim 1, wherein the power consumption determination component comprises or is in communication with a motor on/off determination module adapted to determining whether a motor of the HVAC unit is on or off at a given time.

11. The apparatus of claim 10 wherein a motor of the HVAC unit is determined to be on when a measured temperature or humidity is changing and off otherwise.

12. The apparatus of claim 1, wherein the power consumption determination component comprises or is in communication with a motor speed estimation module adapted to estimating a speed of a motor of the HVAC unit.

13. The apparatus of claim 12 wherein the motor speed is estimated based on a deriving measured temperature or humidity with respect to time.

14. The apparatus of claim 1, wherein the power consumption determination component comprises or is in communication with a power derivative estimation module adapted to determine the power consumption of increasing or decreasing a target temperature or humidity of an environment of the HVAC unit in one unit.

15. The apparatus of claim 1, wherein the power consumption determination component comprises or is in communication with an internal temperature estimation module for assessing an internal temperature of the HVAC unit.

16. The apparatus of claim 1, wherein at least one sensor is selected from the group consisting of a temperature sensor and a humidity sensor.

17. The apparatus of claim 1, wherein the information receiving module is adapted to receive information from at least one source selected from the group consisting of: a weather information module, a user actions transmitter; an occupancy sensor; and a sensor for sensing whether a door or a window is open.

18. An apparatus having a processing unit and a storage device, comprising:
an information receiving module for receiving information from at least one source selected from the group consisting of a temperature sensor and a humidity sensor external to a Heating Ventilation or Air-Conditioning (HVAC) unit;
a long term obtaining and analysis module for obtaining a behavioral model of the HVAC unit; and
a power consumption determination component for assessing power consumption of the HVAC unit based on the information received from the at least one sensor and based on the behavioral model, wherein the power consumption determination component comprising at least one module selected from the group consisting of: a motor on/off estimation module; a motor speed estimation module; and a power derivative estimation module.

19. A method comprising:
receiving, directly or indirectly, information related to a Heating Ventilation or Air-Conditioning (HVAC) unit from at least one sensor external to the HVAC unit; and
determining a behavioral model of the HVAC based on observations provided by the at least one sensor, wherein the behavioral model is determined independently of factory data of a model of the HVAC unit;
indirectly assessing, by a processor, power consumption of the HVAC unit from the behavioral model and from further observations received from the at least one sensor.

20. The method of claim 19, further comprising:
obtaining information describing at least one long term behavior of the HVAC unit,
wherein assessing the power consumption of the HVAC unit is based also on the long term behavior and comprises determining at least one aspect selected from the group consisting of: motor on/off; motor speed; power derivative; fan speed; internal temperature; and air filter state.

21. An apparatus comprising:
a processor being configured to perform the steps of:
receiving a set of physical measurements over time from a physical location that is affected by a Heating Ventilation or Air-Conditioning (HVAC) unit, the physical measurements received from at least one sensor external to the HVAC unit;
fitting the set of physical measurements on a predetermined curve using parametric fit, wherein the predetermined curve has a horizontal asymptote, wherein the predetermined curve has a decreasing slope over time; and
comparing a target measurement of the HVAC unit with a location of the horizontal asymptote to determine whether the HVAC unit is expected to reach the target measurement.

22. The apparatus of claim 21, wherein said apparatus comprising a display, wherein said processor is further adapted to provide an output to a user on the display based on the determination whether the HVAC unit is excepted to reach the target measurement.

23. An apparatus comprising:
a processor being configured to perform the steps of:
receiving a set of physical measurements over time from a physical location that is affected by an Heating Ventilation or Air-Conditioning (HVAC) unit, the physical measurements received from at least one sensor external to the HVAC unit;
fitting the set of physical measurements on a predetermined curve using parametric fit, wherein the predetermined curve has an horizontal asymptote, wherein the predetermined curve has a decreasing slope over time; and
estimating, based on the fitted curve, a time period until a target measurement is expected to be measured in the physical location.

24. The apparatus of claim 23, wherein said apparatus comprising a display, wherein said processor is further adapted to display to a user on the display the time period.

* * * * *